US011376640B2

(12) United States Patent
Rotondaro et al.

(10) Patent No.: US 11,376,640 B2
(45) Date of Patent: Jul. 5, 2022

(54) APPARATUS AND METHOD TO ELECTROSTATICALLY REMOVE FOREIGN MATTER FROM SUBSTRATE SURFACES

(71) Applicant: Tokyo Electron Limited, Tokyo (JP)

(72) Inventors: Antonio Luis Pacheco Rotondaro, Austin, TX (US); Derek Bassett, Austin, TX (US); Trace Quentin Hurd, Austin, TX (US); Ihsan Simms, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 289 days.

(21) Appl. No.: 16/573,744

(22) Filed: Sep. 17, 2019

(65) Prior Publication Data

US 2020/0101500 A1    Apr. 2, 2020

Related U.S. Application Data

(60) Provisional application No. 62/739,482, filed on Oct. 1, 2018.

(51) Int. Cl.
*B08B 6/00*      (2006.01)
*H01L 21/683*    (2006.01)
(Continued)

(52) U.S. Cl.
CPC .......... *B08B 6/00* (2013.01); *H01J 37/32541* (2013.01); *H01J 37/32715* (2013.01);
(Continued)

(58) Field of Classification Search
CPC . B08B 6/00; H01J 2237/335; H01J 37/32541; H01J 37/32715; H01L 21/67028; H01L 21/6833
See application file for complete search history.

(56) References Cited

U.S. PATENT DOCUMENTS 5,179,498 A * 1/1993 Hongoh .................. H02N 13/00
                                                      269/903
5,858,192 A   1/1999 Becker
(Continued)

FOREIGN PATENT DOCUMENTS

DE    102006023238 A1   11/2007
JP       2004259832 A *  9/2004
(Continued)

OTHER PUBLICATIONS

Kanetsuki et al. (JP 2004259832 A, Computer Translation filed Mar. 30, 2020). (Year: 2020).*
(Continued)

*Primary Examiner* — Duy Vu N Deo
*Assistant Examiner* — Christopher Remavege
(74) *Attorney, Agent, or Firm* — Slater Matsil, LLP (57) ABSTRACT

In one exemplary embodiment, described herein are innovative techniques for reducing the attractive force between particles and a substrate surface to aid in the removal of particles from the substrate surface. More specifically, a multi-electrode chuck is utilized to assist in cleaning a substrate. The multi-electrode chuck is utilized to reduce the attractive forces between particles and the substrate and to move the loosened particles that are present on the substrate surface. The electrodes of the chuck are biased with alternating current (AC) voltages with a phase shift between the electrode bias waves. The resulting electric field wave on the substrate surface loosens the particles by polarizing the particles and moves the loosened particles across the substrate.

20 Claims, 7 Drawing Sheets

(51) Int. Cl.
*H01J 37/32* (2006.01)
*H01L 21/67* (2006.01)

(52) U.S. Cl.
CPC .... *H01L 21/67028* (2013.01); *H01L 21/6833* (2013.01); *H01J 2237/335* (2013.01)

(56) References Cited

U.S. PATENT DOCUMENTS

| | | | |
|---|---|---|---|
| 6,056,861 A | 5/2000 | Fuhr | |
| 7,628,864 B2 | 12/2009 | Moriya et al. | |
| 7,651,586 B2 | 1/2010 | Moriya et al. | |
| 7,744,737 B1 | 6/2010 | James | |
| 7,867,409 B2 | 1/2011 | Brcka | |
| 7,869,556 B2* | 1/2011 | Morfill | H01J 37/32036 376/127 |
| 8,052,798 B2 | 11/2011 | Moriya et al. | |
| 8,091,167 B2* | 1/2012 | Teo | B08B 6/00 359/507 |
| 8,137,473 B2 | 3/2012 | Moriya et al. | |
| 8,409,398 B2 | 4/2013 | Brcka | |
| 8,916,055 B2 | 12/2014 | Brcka | |
| 9,228,261 B2 | 1/2016 | Brcka | |
| 9,796,001 B2* | 10/2017 | Sim | H01L 21/0209 |
| 10,228,624 B2* | 3/2019 | Yonekawa | G03F 7/70708 |
| 10,277,164 B2* | 4/2019 | Guo | B32B 38/145 |
| 10,413,913 B2 | 9/2019 | Brcka | |
| 10,493,503 B2* | 12/2019 | Rutks | B08B 6/00 |
| 2002/0063060 A1 | 5/2002 | Gascoyne | |
| 2004/0055891 A1 | 3/2004 | Pamula | |
| 2004/0058423 A1 | 3/2004 | Albritton | |
| 2005/0032204 A1 | 2/2005 | Rodgers | |
| 2006/0060303 A1 | 3/2006 | Fink | |
| 2006/0115828 A1 | 6/2006 | Palmieri | |
| 2007/0095669 A1 | 5/2007 | Lau | |
| 2007/0125650 A1 | 6/2007 | Scurati | |
| 2007/0223174 A1* | 9/2007 | Mori | C04B 35/581 361/234 |
| 2008/0132046 A1 | 6/2008 | Walther | |
| 2009/0173527 A1 | 7/2009 | Benke | |
| 2009/0288684 A1 | 11/2009 | Kitaoka | |
| 2009/0314644 A1 | 12/2009 | Golan | |
| 2009/0325256 A1 | 12/2009 | Yasukawa | |
| 2011/0076734 A1 | 3/2011 | Zhou | |
| 2011/0079513 A1 | 4/2011 | Stelzle | |
| 2011/0129892 A1 | 6/2011 | Umezu | |
| 2011/0168558 A1 | 7/2011 | Fransaer | |
| 2012/0135158 A1 | 5/2012 | Freer | |
| 2015/0152556 A1 | 6/2015 | Brcka | |
| 2015/0174623 A1* | 6/2015 | Rutks | B08B 6/00 96/99 |
| 2016/0151808 A1* | 6/2016 | Thirunavukarasu | B08B 6/00 134/1 |
| 2016/0236245 A1* | 8/2016 | Lew | H01L 21/0209 |
| 2016/0336196 A1* | 11/2016 | Sim | H01L 21/02057 |
| 2017/0214359 A1* | 7/2017 | McKarris | H01L 31/0547 |
| 2017/0235234 A1* | 8/2017 | Yonekawa | G03F 7/0002 355/72 |
| 2020/0061678 A1* | 2/2020 | Tombs | B08B 6/00 |

FOREIGN PATENT DOCUMENTS

| | | |
|---|---|---|
| JP | 2004259832 A | 9/2004 |
| JP | 2010524442 A | 7/2010 |
| JP | 2013197465 A | 9/2013 |
| KR | 20020091337 A | 12/2002 |
| KR | 100421171 B1 | 3/2004 |
| KR | 100745966 B1 | 8/2007 |
| TW | 232896 B | 5/2005 |
| WO | 2007116406 A1 | 10/2007 |
| WO | 2008018390 A1 | 2/2008 |
| WO | 2008128717 A1 | 10/2008 |

OTHER PUBLICATIONS

Liu et al., "Particle transport by standing waves on an electric curtain", Journal of Electrostatics 68 (2010), p. 289-298. (Year: 2010).*

Korean Intellectual Property Office, The International Search Report and the Written Opinion for International application No. PCT/US2019/051548, dated Mar. 24, 2020, 12 pg.

Machine translation into English of Japanese Patent Application Publication No. JP-2004259832, Kazuhiko et al., Sharp KK, published on Sep. 16, 2004.

Machine translation into English of Japanese Patent Application Publication No. JP-2013197465, Takuya, Mizutani, Toshiba Corp, published on Sep. 30, 2013.

Machine translation into English of Korean Patent Application Publication No. KR-100421171, Sik, Choi Jin, Komi Co Ltd., published on Mar. 3, 2004.

Machine translation into English of Korean Patent Application Publication No. KR-100745966, Hwan, Shim Jae, Dongbu Electronic Co Ltd., published on Aug. 2, 2007.

Albrecht et al., Dielectrophoretic Cell Patterning within Tissue Engineering Scaffolds, Proceedings of the Second Joint EMBS/BMES Conference, Houston TX, Oct. 23-26, 2002.

Chen et al., Aligning Single-Wall Carbon Nanotubes with an Alternating-Current Electric Field, Applied Physics Letters, vol. 78, No. 23, pp. 3714-3716, Jun. 4, 2001.

Dimaki et al., Dielectrophoretics of Carbon Nanotubes using Microelectrodes: A Numerical Study, Nanotechnology v15, pp. 1095-1102, Institute of Physics, Jun. 25, 2004.

Ho et al., Rapid Heterogeneous Liver-Cell On-Chip Patterning via the Enhanced Field-Induced Dielectrophoresis Trap, Lab on Chip v6, pp. 724-734, The Royal Society of Chemistry, May 3, 2006.

Hodge, Experimental Development and Analysis of a Novel Setup for Insulated Dielectrophoresis, MS Thesis, Clemson University, Aug. 2013.

Sebastian et al., Tissue Engineering With Electric Fields: Immobilization of Mammalian Cells in Multilayer Aggregates Using Dielectrophoresis, Biotechnology and Bioengineering, vol. 98, No. 3, pp. 694-700, Wiley Periodicals, Oct. 15, 2007.

* cited by examiner

APPARATUS AND METHOD TO ELECTROSTATICALLY REMOVE FOREIGN MATTER FROM SUBSTRATE SURFACES

CROSS-REFERENCE TO RELATED APPLICATIONS

This application is related to and claims priority from U.S. Patent Application No. 62/739,482, entitled "Apparatus and Method to Electrostatically Remove Foreign Matter from Substrate Surfaces," by Rotondaro, et al., the disclosure of which is expressly incorporated herein by reference in its entirety.

BACKGROUND

The present disclosure relates to the processing of substrates. In particular, it provides an apparatus and method to remove foreign matter from a substrate surface.

During the processing of substrates, unwanted foreign matter (for example unwanted particles) on substrates during various processing steps may lead to the formation of defects in the various structures being formed on the substrate. For example, during formation of semiconductor structures on a substrate, the presence of particles on a substrate during various process steps (such as but not limited to deposition, etch, implant, oxidation, etc. process steps) may lead to defects being formed in the semiconductor structures. Thus, it is desirable to remove particles from the substrate as part of a substrate process flow.

Various forms of physical and chemical techniques are known to have been used to remove particles from substrate surfaces. However many of those techniques have limitations as the underlying layers and patterns may be damaged during the attempts to remove the particles. Improved techniques for particle removal are, thus, desired.

SUMMARY

In one exemplary embodiment, described herein are innovative techniques for reducing the attractive force between particles and a substrate surface to aid in the removal of particles from the substrate surface. More specifically, a multi-electrode chuck is utilized to assist in cleaning a substrate. The multi-electrode chuck is utilized to reduce the attractive forces between particles and the substrate and to move the loosened particles that are present on the substrate surface. The electrodes of the chuck are biased with alternating current (AC) voltages with a phase shift between the electrode bias waves. The resulting electric field wave on the substrate surface loosens the particles by polarizing the particles and moves the loosened particles across the substrate.

In one example embodiment, a substrate processing system is provided. The substrate processing system is configured to remove particles from a surface of a substrate. The substrate processing system comprises a chuck, the chuck configured for placement of the substrate thereon and a plurality of electrodes within the chuck, the electrodes provided in a repeating spaced pattern across the chuck. The substrate processing system further comprises a plurality of voltages coupled to the plurality of electrodes, the plurality of voltages being alternating voltages, the plurality of voltages including a plurality of different voltage signals, the plurality of different voltage signals being phase shifted from each other. The coupling of the plurality of electrodes and the plurality of voltages is provided so that a different voltage signal of the plurality of different voltage signals are provided to adjacent electrodes, the different voltage signal of the plurality of different voltages signals being phase shifted from each other, an arrangement of the plurality of electrodes and the plurality of voltages being such that an alternating electric potential field is created at the surface of the substrate. Further, the plurality of electrodes have a width that equals a height between a top of the electrodes and an upper surface of the substrate, within ±20%.

In another example embodiment, a method of removing particles from a surface of a substrate is disclosed. The method may comprise providing a substrate processing tool, providing a chuck within the substrate processing tool, providing a plurality of electrodes within the chuck, and providing the substrate on the chuck. The method further comprises providing a plurality of phase shifted alternating voltages to the plurality of electrodes, the coupling of the phase shifted alternating voltages to the plurality of electrodes being in a pattern such that adjacent electrodes have voltages that are phase shifted. The method also comprises generating an electric potential at a surface of the substrate through use of the plurality of electrodes and plurality of phase shifted alternating voltages and utilizing the electric potential at the surface of the substrate to remove particles from the surface by moving the particles across the surface of the substrate.

In yet another example embodiment, a method of removing particles from a surface of a semiconductor wafer is disclosed. The method comprises providing a semiconductor processing tool, providing a chuck for holding the semiconductor wafer within the semiconductor processing tool, and providing a plurality of electrodes within the chuck. The method further comprise providing at least three phase shifted alternating voltages to the plurality of electrodes, the coupling of the at least three phase shifted alternating voltages to the plurality of electrodes being in a pattern such that adjacent electrodes have voltages that are phase shifted. The method also comprises generating an electric potential at a surface of the semiconductor wafer through use of the plurality of electrodes and the at least three phase shifted alternating voltages. The method further comprise utilizing the electric potential at the surface of the semiconductor wafer to remove particles from the surface by moving the particles across the surface of the semiconductor wafer, wherein the electric potential at the surface of the semiconductor wafer alternates across the semiconductor wafer due to phase shifts in the at least three phase shifted alternating voltages.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

In one exemplary embodiment, described herein are innovative techniques for reducing the attractive force between particles and a substrate surface to aid in the removal of particles from the substrate surface. More specifically, a multi-electrode chuck is utilized to assist in cleaning a substrate. The multi-electrode chuck is utilized to reduce the attractive forces between particles and the substrate and to move the loosened particles that are present on the substrate surface. The electrodes of the chuck are biased with alternating current (AC) voltages with a phase shift between the electrode bias waves. The resulting electric field wave on the substrate surface loosens the particles by polarizing the particles and moves the loosened particles across the substrate.

The multi-electrode chuck may be utilized as part of a stand-alone clean process or may be used in conjunction with a wide variety of wet or dry processes. In one embodiment, the electrodes may be configured to have three phase shifts between the electrodes, at 120 degrees of phase shift each. It will be recognized, however, that more or less phase shifts may be utilized. Each electrode may be insulated from the other adjacent phase shifted electrodes and from the substrate which may reside on the multi-electrode chuck. The use of electrostatic forces to move the particles across the substrate results from the phase shifted electrodes as described in more detail below. Further, such techniques allow for the removal of particles without causing pattern damage or otherwise impacting pattern integrity of the substrate.

Through the use of charge modulation, particles may be removed from a substrate at any of a wide variety of process points. Thus, the multi-electrode chuck and the electrostatic movement technique described may be utilized as part of a variety of plasma equipment (including etch and deposition), chemical vapor deposition equipment, cleaning equipment, implant equipment etc. As mentioned, the equipment may include wet or dry process equipment. Further, the techniques described herein are not limited to a particular process step of a substrate process flow. In one embodiment, the substrate may be a semiconductor substrate having one or more semiconductor processing layers formed thereon. In another embodiment, the semiconductor substrate is a semiconductor wafer. As mentioned, the cleaning techniques described may be used to remove foreign matter at any of a wide variety of points of a substrate process flow. For example, the techniques described herein may be utilized at front end of line process step or may be utilized at a back end of line process step.

Figure 1A:
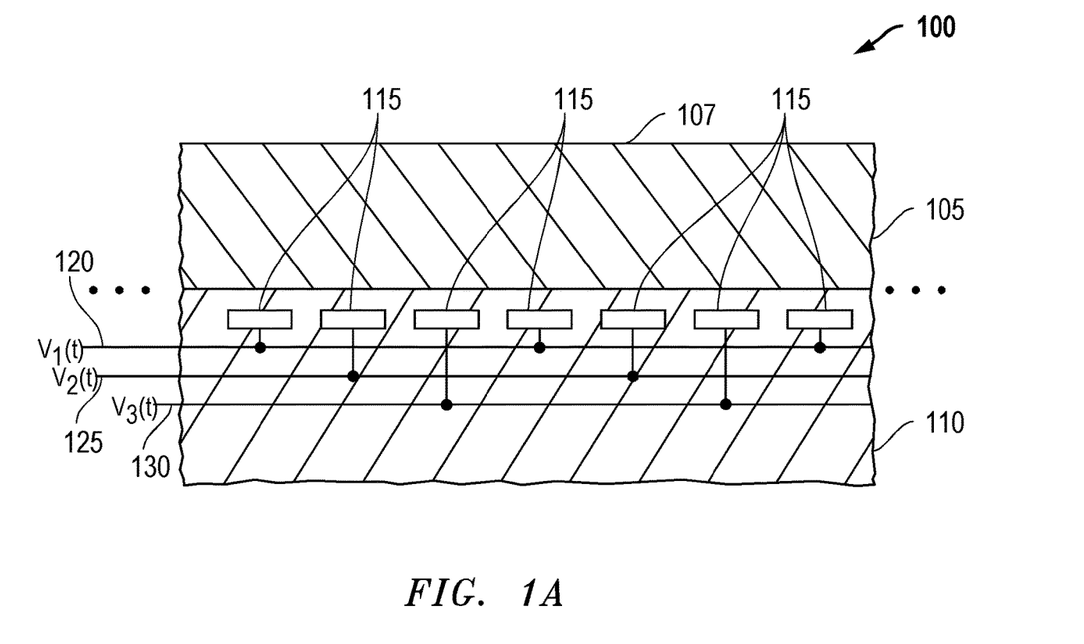
FIG. 1A illustrates an exemplary system utilizing an example of a multi-electrode chuck and phase shifted voltages.
Figure 1B:
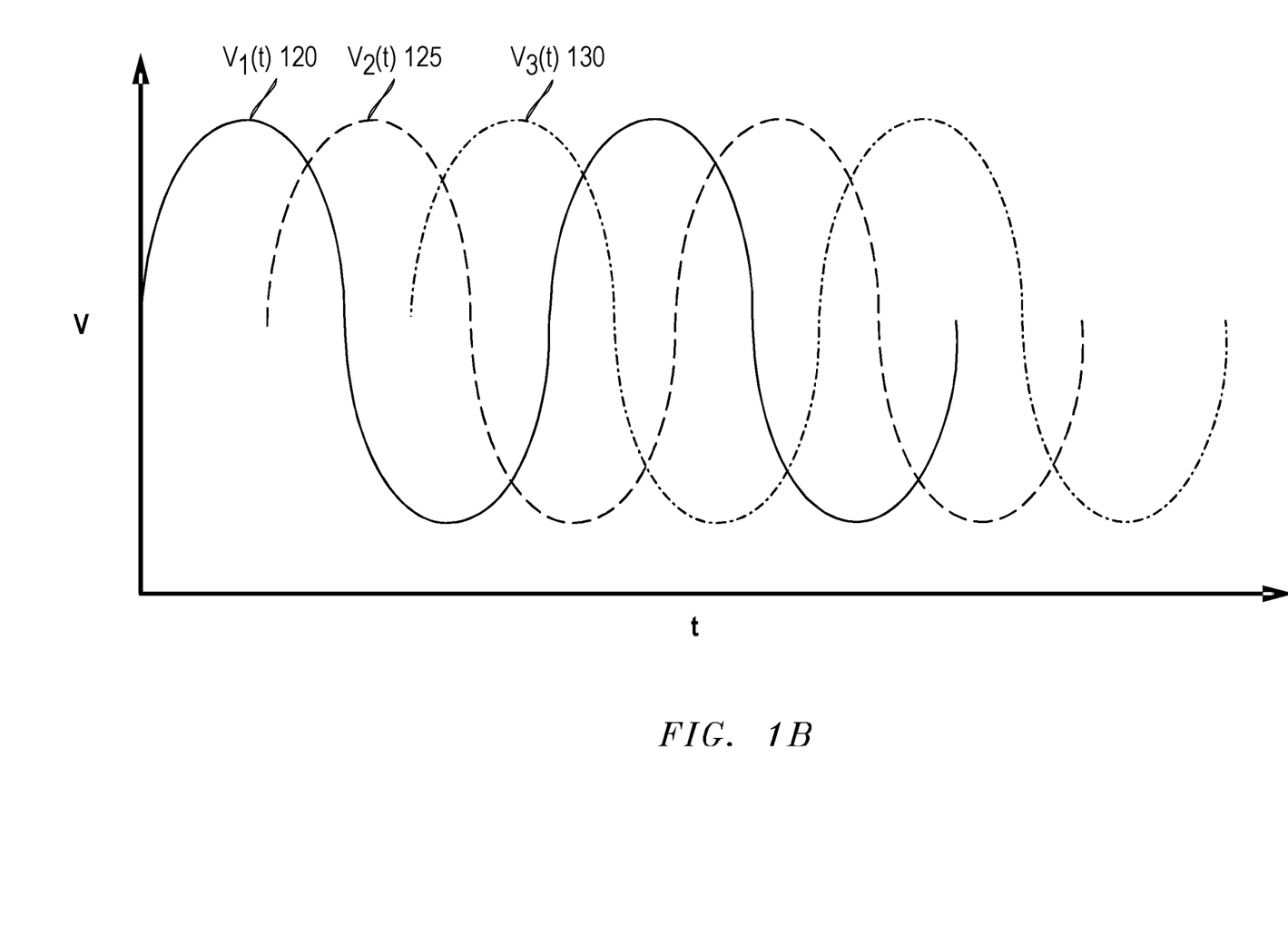
FIG. 1B illustrates a graph of phase shifted voltages.

FIG. 1A illustrates a system 100 which illustrates at least some of the techniques described herein. As shown in FIG. 1A, a substrate 105 is provided upon a chuck 110. Substrate 105 has a substrate surface 107. Substrate surface 107 is the surface from which it is desired to remove particles or foreign matter. A plurality of electrodes 115 may be embedded within a dielectric of the chuck 110. The electrodes 115 are connected to a voltages $V_1(t)$ 120, $V_2(t)$ 125 and $V_3(t)$ 130. Each of the voltages $V_1(t)$ 120, $V_2(t)$ 125 and $V_3(t)$ 130 may be an AC voltage. Further, the phase of each voltage may be shifted from the other voltages. For example, $V_1(t)$ 120 may be shifted in phase 120 degrees from $V_2(t)$ 125, $V_2(t)$ 125 may be shifted in phase 120 degrees from $V_3(t)$ 130, and $V_3(t)$ 130 may be shifted in phase 120 degrees from $V_1(t)$ 120. FIG. 1B illustrates an exemplary graph of the voltages $V_1(t)$ 120, $V_2(t)$ 125 and $V_3(t)$ 130 as a function of voltage and time. Thus, in one embodiment, at least three phase shifted voltages may be provided as shown in the figure. It will be recognized that the use of three different phase shifted voltages is merely exemplary and the techniques described herein may be utilized with another number of phase shifted voltages. Further, the amount of phase shift between the voltages may be more or less than 120 degrees of phase shift. In FIG. 1A, only a section of substrate 105 and chuck 110 are shown for ease of illustration. Thus, it will be recognized that the substrate 105 and chuck 110 may have extended boundaries as compared to that shown in the figures and more electrodes 115 than shown may be provided to extend to such boundaries. The chuck 110 may be comprised of a wide range of materials as the techniques described herein are not limited to a particular type of chuck. In one example the chuck 110 may be comprised of anodized aluminum with electrodes 115 embedded in a dielectric. In another embodiment the chuck 110 may be comprised of a sintered ceramic with the electrodes 115 embedded in a dielectric. A wide range of types of wiring may be utilized to connect the electrodes 115 to voltage sources. In one embodiment, copper wiring encased in a polyimide film may be utilized.

Figure 2:
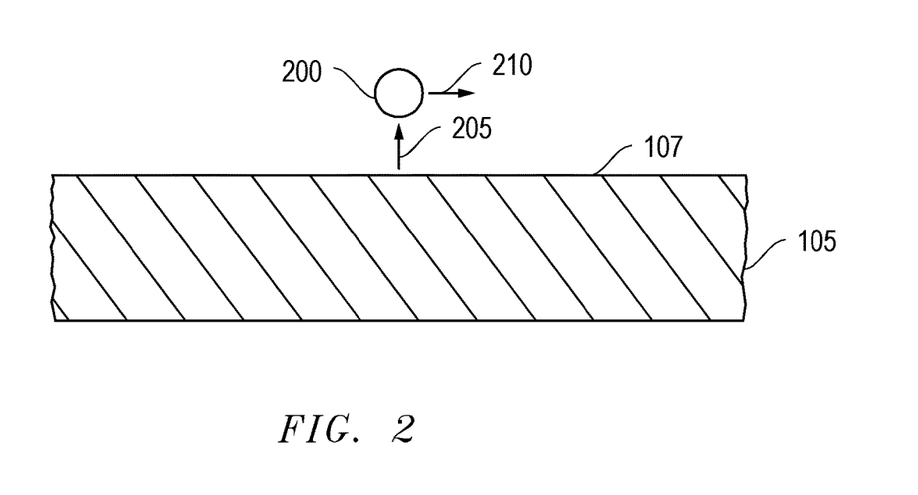
FIG. 2 illustrates forces which may remove a particle from a substrate.

The voltages provided to the electrodes 115 will create voltage potentials in the chuck 110, substrate 105 and at the substrate surface 107. These voltages may be used to counteract forces which may attract a particle to a surface (for example van der Waals forces and capillary forces). More particularly, the voltage potential at the substrate surface 107 may provide a force on a particle 200 such as force 205 that is perpendicular to the substrate surface 107 as shown in FIG. 2. In addition, the alternating nature of the voltages $V_1(t)$ 120, $V_2(t)$ 125 and $V_3(t)$ 130 and the phase shifts amongst the voltages will also create a force parallel to the substrate surface 107, such as force 210 as shown in FIG. 2. The force 205 and force 210 may result from coulombic and dielectrophoretic forces. The force 205 and force 210 may result in movement of the particle 200 across the substrate surface 107 so that the particle 200 may be removed from the substrate 105. The electrodynamic and electrostatic movement of particles results from an "electric curtain" effect of the voltage potentials at the surface. Such movement of charged particles has been described in more detail in Tatom et al., "Lunar Dust Degradation Effects and Removal/Prevention Concepts" NASA Technical Report No. TR-792-7-207A, June 1967, Masuda et al, "Theoretical Characteristics Of Standing-Wave Electric Curtains", Electrical Engineering in Japan, Vol. 93, No. 1, 1973, and Calle et al., "Particle Removal By Electostatic And Dielectrohoretic Forces For Dust Control During Lunar Exploration Missions", Nasa Electrostatics And Surface Physics Laboratory, 2009.

Figure 3:
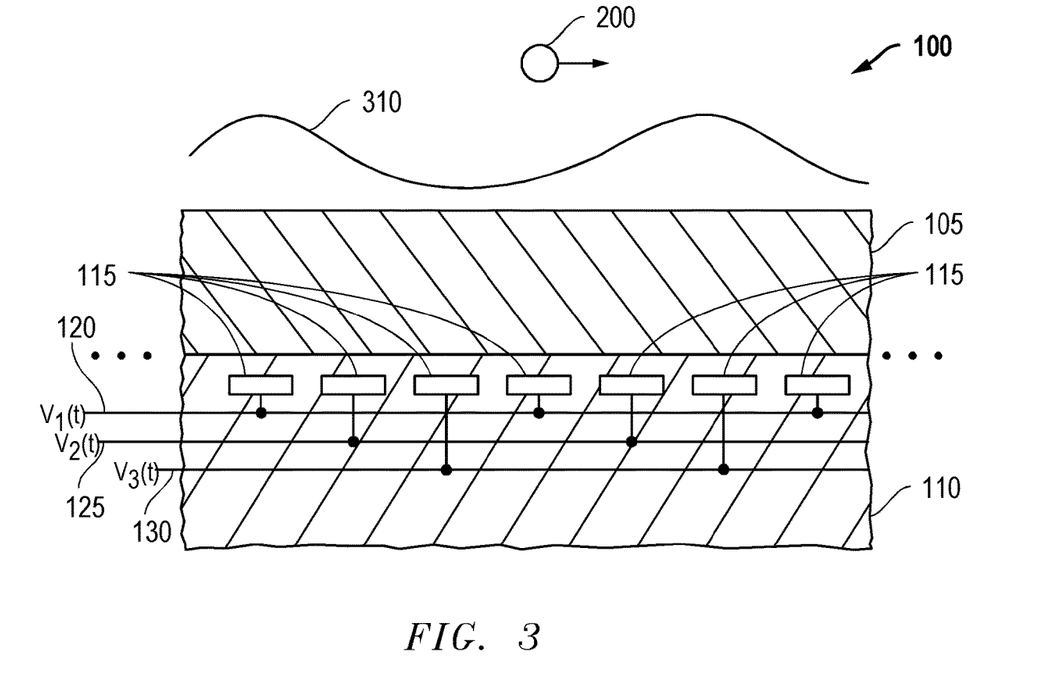
FIG. 3 illustrates an exemplary potential created at a substrate surface utilizing an example of a multi-electrode chuck and phase shifted voltages.

FIG. 3 illustrates the voltage potential at the substrate surface superimposed upon the structures of FIG. 1. As shown in FIG. 3, the phase shift of the voltages $V_1(t)$ 120, $V_2(t)$ 125 and $V_3(t)$ 130 will create a voltage potential at a given time such as shown by voltage potential plot 310. As shown in FIG. 3, the voltage potential is shown at a particular instance in time. As the voltages $V_1(t)$ 120, $V_2(t)$ 125 and $V_3(t)$ 130 are alternating, the substrate surface voltage potential as shown in plot 310 will likewise alternate, creating a voltage wave moving across the substrate surface, for example such as in a direction such as shown by arrow 200. This voltage potential change will help drive the particles across the substrate surface as described by the forces mentioned above.

Figure 4:
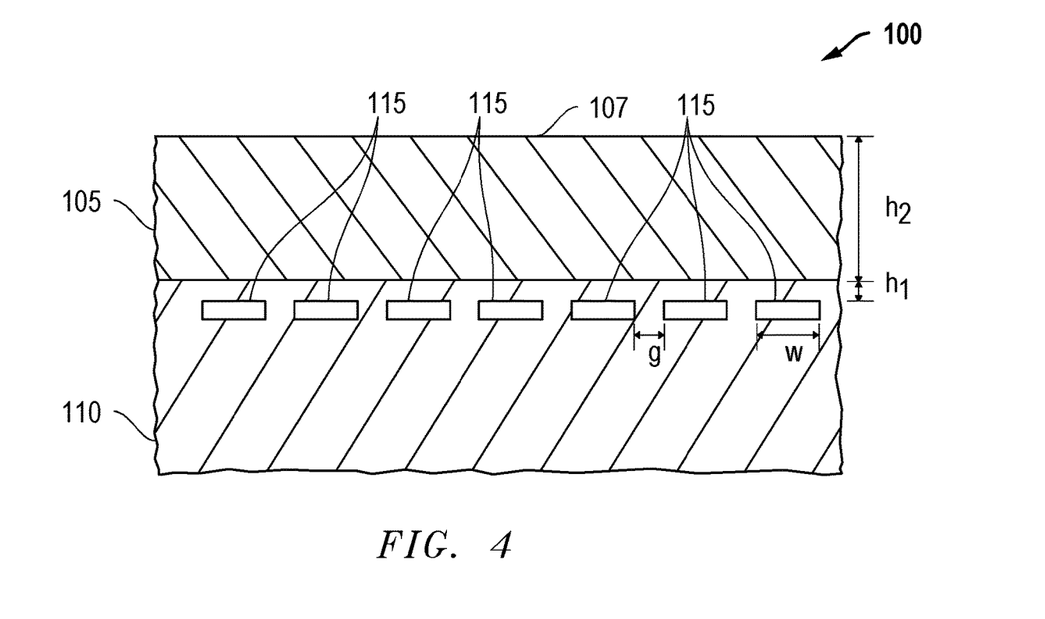
FIG. 4 illustrates exemplary dimensions of a multi-electrode chuck and substrate.

The ability to move particles located upon a substrate surface will depend upon the relationship of the various geometries of the substrate 105, chuck 110 and electrodes 115, as such geometries will impact the absolute value of the forces and the gradients of the forces across the surface. As shown in FIG. 4, the electrodes may have a width w and a spacing g. The substrate 105 may have a thickness $h_2$ and the electrodes may be embedded in a dielectric that has a dielectric thickness from the electrodes 115 to the chuck surface as shown as thickness $h_1$. The total thickness from the electrodes 115 to the substrate surface 107 is thus $h=h_1+h_2$.

As the electrode widths and electrode spaces become significantly less than the total thickness (w<h and g<h), the gradients of the electric fields at the substrate surface become smoothed out and too small to adequately move particles. Conversely if the electrode widths or electrode spaces become significantly greater than the total thickness (w>h or g>h), there may exist strong electric field gradients on the substrate surface corresponding to locations of the electrode edges, however there may be areas that see little dielectrophoretic forces. Further, as the spacing g becomes too narrow, arcing between electrodes may become problematic. Thus geometries such that both w and g are close to the thickness h are advantageous. Further, providing electrode spaces and widths that are approximately equal generates coulombic forces across the entire substrate surface that are sufficient to move particles. In one embodiment the width w and the space g are sized within a range of ±20% of the thickness h, in another embodiment within a range of ±15% of the thickness h, and in a more preferred embodiment within a range of ±5% of the thickness h. Thus, in one exemplary embodiment, at least one geometric characteristic of the electrode may be dependent upon the size of the substrate. In one embodiment, electrode widths and electrode spaces may range from 0.3 mm to 3 mm.

In one embodiment, the substrate may be a semiconductor wafer in which the wafer thickness and the thickness of dielectric above the electrodes in the chuck is approximately 1000 microns (approximately 1 mm). In such case, electrodes having a width of 1 mm and spaces of 1 mm may be provided. In such an example, three phase shifted voltages (shifted by 120 degrees) may be provided. The voltages may have a frequency of 1 to 500 kHz and in a more preferred range 1 to 100 Hz. The voltages may range from 2000 to 8000 V. In one embodiment the voltages may be 100 Hz, 4000 V voltages. It will be recognized that other voltage frequencies and values may be utilized and that other geometries may be utilized. Thus, depending upon the particular application the variables provided herein may be changed.

Figure 5:
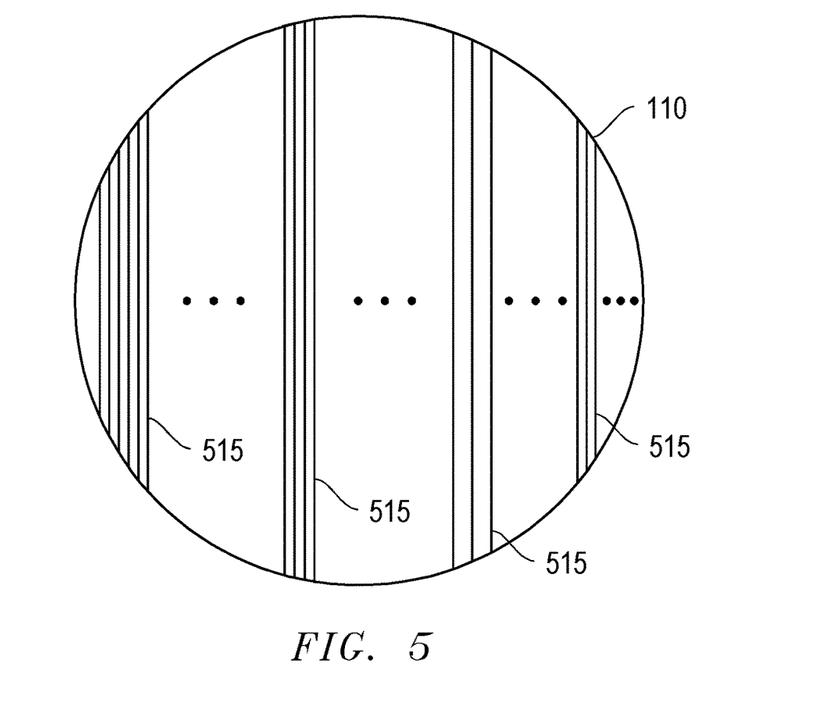
FIG. 5 illustrates an exemplary pattern of multiple electrodes in a chuck.

The particular pattern of the electrodes in the chuck may be accomplished in a wide variety of formats. For example, as shown in FIG. 5 a top view of a chuck 110 (for example a chuck for use with a circular semiconductor wafer) is shown. The chuck 110 may have a series of parallel electrodes 515 embedded in the chuck in a pattern of parallel electrodes as shown which extend across the chuck 110 (for ease of illustration and understanding not all electrodes are shown). It will be recognized that as described above, the parallel electrodes 515 may be embedded within the chuck and the visualization of the electrodes at a top view is merely provided for illustrative purposes. Every third parallel electrode 515 may be electrically connected together (such as shown in FIG. 1) and the parallel electrodes 515 provided with three phase shifted voltages, for example each phase shifted by 120 degrees. In such an embodiment, the use of the parallel electrodes 515 and the phase shifted voltages results in particles moving across the substrate (for example in a left to right or right to left movement for the electrode pattern as shown in FIG. 5). Again as mentioned above, the concepts described herein are not limited to the use of three voltages and three phase shifts as more or less voltages may be utilized.

Figure 6:
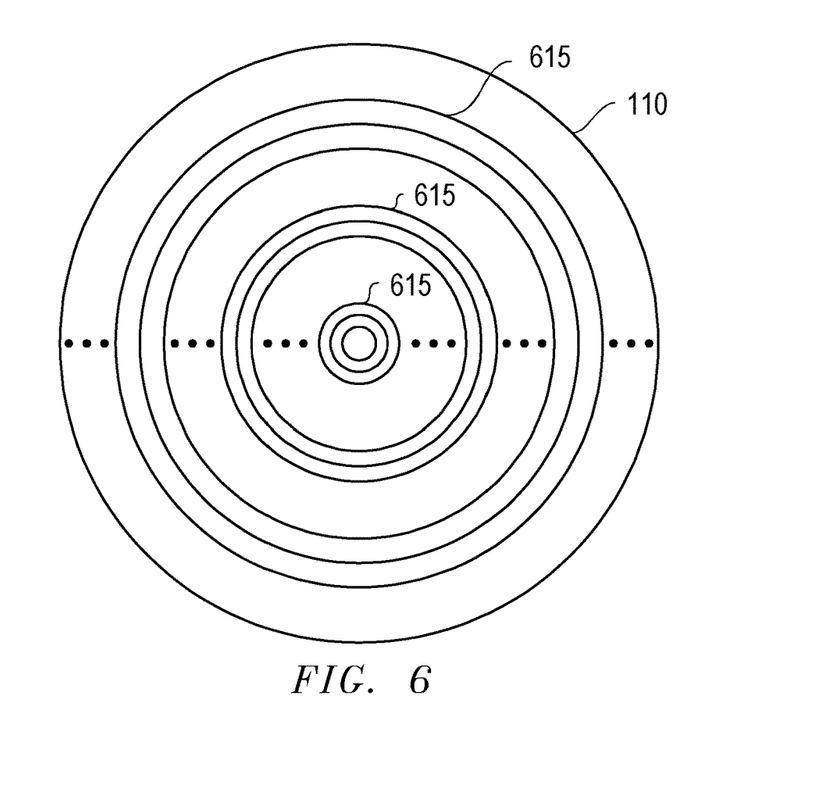
FIG. 6 illustrates another exemplary pattern of multiple electrodes in a chuck.

In another embodiment, the electrodes may be comprised of a series of electrodes arranged in concentric circles. For example, FIG. 6 illustrates a subset of the electrodes 615 which may be arranged in a circular fashion across a chuck 110. In such the embodiment of FIG. 6, the use of the electrodes 615 and the phase shifted voltages results in particles moving across the substrate in a center to edge direction. It will be recognized that the patterns of FIGS. 5 and 6 are merely exemplary and shown in conjunction with an exemplary circular chuck. Other chucks and other electrode patterns may be used. Patterns may include, for example, but are not limited to, square shaped electrode patterns, spiral electrode patterns, etc.

The techniques described herein may be utilized as part of a stand-alone substrate clean process or may be utilized as part of another substrate processing step. Thus, for example, a process tool may be provided with a chuck and voltage sources configured as described herein as a stand-alone process tool that is used merely to remove particles from a substrate. Alternatively, the chuck configuration described herein may be utilized in conjunction with standard substrate processing tools. For example, a plasma process tool may have a chuck altered to provide the particle removal voltages and configurations described herein. Thus, a plasma etch or plasma deposition tool may incorporate the use of particle removal voltages as described herein either before the plasma process, during the plasma process or after the plasma process. As it is known the art, some plasma tools may provide a high or low frequency voltage (for example in ranges from 0.2 MHz to 150 MHz) to upper and/or lower electrodes to assist in the plasma processing. The use of the electrodes embedded in a multi-electrode chuck as described herein may be provided in addition to other voltages applied to upper and/or lower electrodes used to generate a plasma in a plasma system. In other, embodiments, the chuck configuration described herein may be utilized with wet processing tools (including wet clean tools) to assist in removal of particles from a substrate. In such cases, the chucks of the wet processing tools may be adapted to be a multi-electrode chuck as described herein. The forces described herein may be utilized in conjunction with fluid forces that are generated in the wet process tool to remove particles from the substrate. Further, air jets blowing across the substrate may assist in moving particles across the substrate. Thus, as described herein, the electrodynamic and electrostatic forces provided through the chuck need not be the only forces acting on a particle to assist in removing the particle from the substrate. It will be recognized that many other processing tools may also utilize the concepts described herein.

Any of a wide variety of techniques may be utilized to generate the phase shifted voltages described herein (for example the three different voltages signals of FIG. 1, voltages $V_1(t)$ 120, $V_2(t)$ 125 and $V_3(t)$ 130). It will be noted that the alternating voltages may take on a number of different forms. For example, sinusoidal voltages, square wave voltages, sawtooth voltages or other voltage shapes may be used. Voltage generators for such alternating voltages are well-known in the substrate processing art. Further, each voltage may be generated by a separate voltage generator or a common voltage generator may be used with phase shifting circuitry provided to supply the phase shifted voltages. Other techniques may also be utilized as the techniques described herein are not limited to the particular voltage generator technique.

Figure 7:
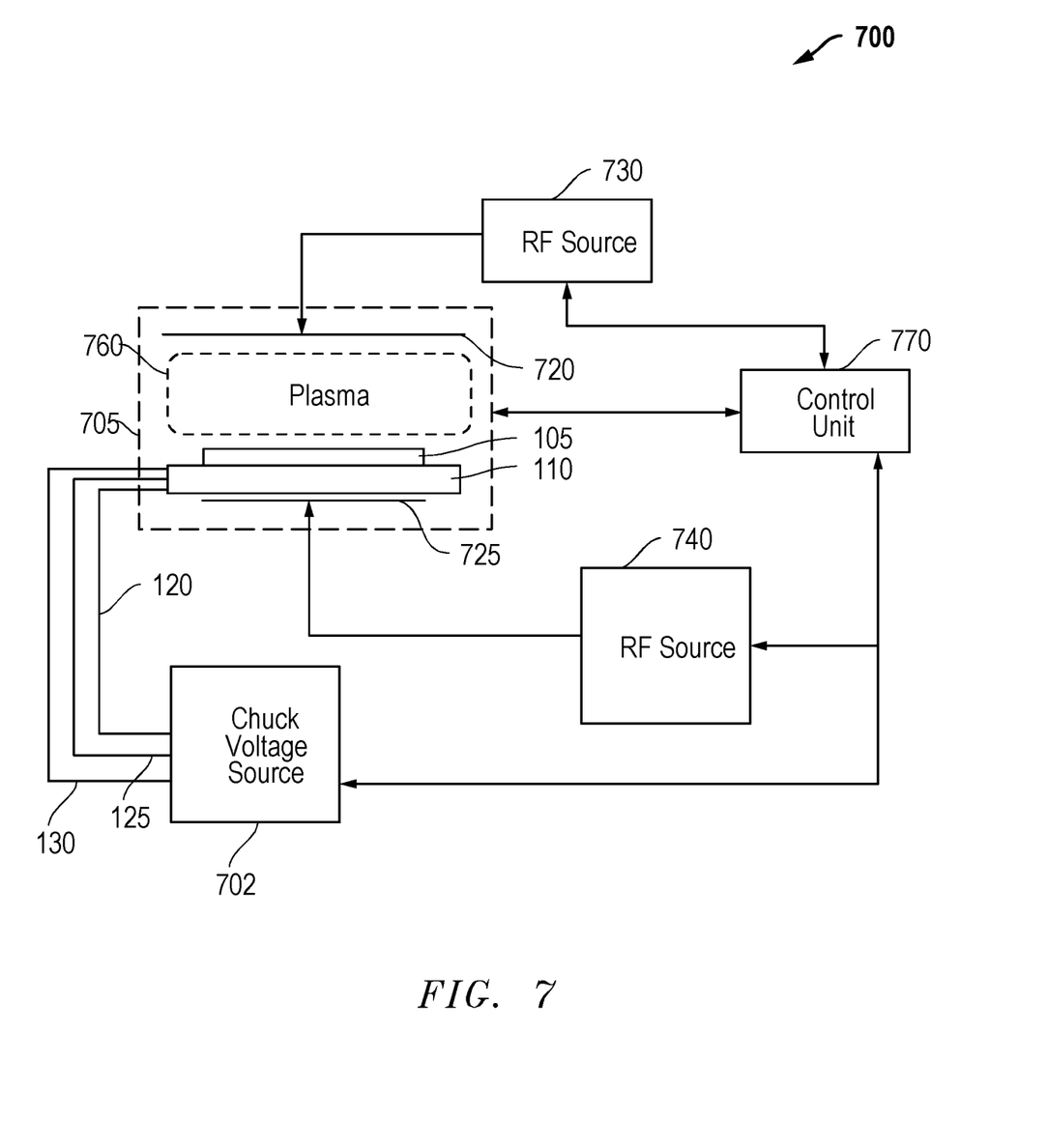
FIG. 7 illustrates an exemplary substrate processing tool utilizing a multi-electrode chuck.

As mentioned above, chucks having multiple phase shifted electrodes may be used in a wide range of process tools. One exemplary process tool is shown in FIG. 7. It will be recognized that the embodiment of FIG. 7 illustrates a plasma process tool but the illustration of a plasma process tool is merely exemplary and the techniques described herein are not limited to such tools. As shown in the exemplary system of FIG. 7, a plasma processing system 700 is provided. The exemplary type of plasma processing system is a capacitively coupled plasma (CCP) system, however other plasma systems may be used. The plasma processing system 700 may include a process chamber 705. As is known in the art, process chamber 705 may be a pressure controlled chamber. A substrate 105 (in one example a semiconductor wafer) may be held on a stage or chuck 110. An upper electrode 720 and a lower electrode 725 may be provided as shown. The upper electrode 720 may be electrically coupled to an upper radio frequency (RF) source 730. The upper RF source 730 may provide an upper frequency voltage at an upper frequency $f_U$. The lower electrode 725 may be electrically coupled to a lower RF source 740. The lower RF source 740 may provide a lower frequency voltage at a lower frequency $f_L$. It will be recognized by those skilled in the art that many other components (not shown) may be included in the plasma processing system 700 or the components shown may be excluded depending upon what type of plasma processing system 700 is utilized.

A chuck voltage source 702 is provided so as to generate phase shifted voltages $V_1(t)$ 120, $V_2(t)$ 125 and $V_3(t)$ 130 which are coupled to the electrodes (not shown) in the chuck 110 as described above, for example as shown in FIG. 1. Though shown as one voltage source, the chuck voltage source 702 may be multiple separate voltage sources. Alternatively, the voltages $V_1(t)$ 120, $V_2(t)$ 125 and $V_3(t)$ 130 may be provided from other sources in the system, for example the various RF sources may also be configured to provide the phase shifted voltages $V_1(t)$ 120, $V_2(t)$ 125 and $V_3(t)$ 130 (even including providing lower non-RF voltages).

Components of the plasma processing system 700 can be connected to, and controlled by, a control unit 770 which in turn can be connected to a corresponding memory storage unit and user interface (all not shown). Various plasma processing operations can be executed via the user interface, and various plasma processing recipes and operations can be stored in the storage unit. Accordingly, a given substrate can be processed within the plasma processing chamber with various microfabrication techniques. The control unit 770 may be coupled to various components of the plasma processing system 700 to receive inputs from and provide outputs to the other components. The control unit 770 can be implemented in a wide variety of manners. For example, the control unit 770 may be a computer. In another example, the control unit may be comprised off one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, flash memory, dynamic random access memory (DRAM) memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing apparatus uses the upper and lower electrodes to generate a plasma 760 in the process chamber 705 when applying power to the system from the upper RF source 730 and/or the lower RF source 740. Further, as is known in the art, ions generated in the plasma 760 may be attracted to the substrate 105. The generated plasma can be used for processing a target substrate (such as substrate 105 or any material to be processed) in various types of treatments such as, but not limited to, plasma etching, chemical vapor deposition, treatment of semiconductor material, glass material and large panels such as thin-film solar cells, other photovoltaic cells, and organic/inorganic plates for flat panel displays, etc.

Application of power results in a high-frequency electric field being generated between the upper electrode 720 and the lower electrode 725. Processing gas delivered to process chamber 705 can then be dissociated and converted into a plasma. As shown in FIG. 7, the exemplary system described utilizes both upper and lower RF sources. For example high-frequency electric power, for an exemplary capacitively coupled plasma system, in a range from about 3 MHz to 150 MHz may be applied from the upper RF source 730 and a low frequency electric power in a range from about 0.2 MHz to 40 MHz can be applied from the lower RF source. It will be recognized that the techniques described herein may be utilized in a variety of other plasma systems. In one example system, the sources may be switched (higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized, etc. As mentioned above, the techniques described herein may be implemented in other types of plasma systems and may also be implemented in non-plasma process tools.

Figure 8:
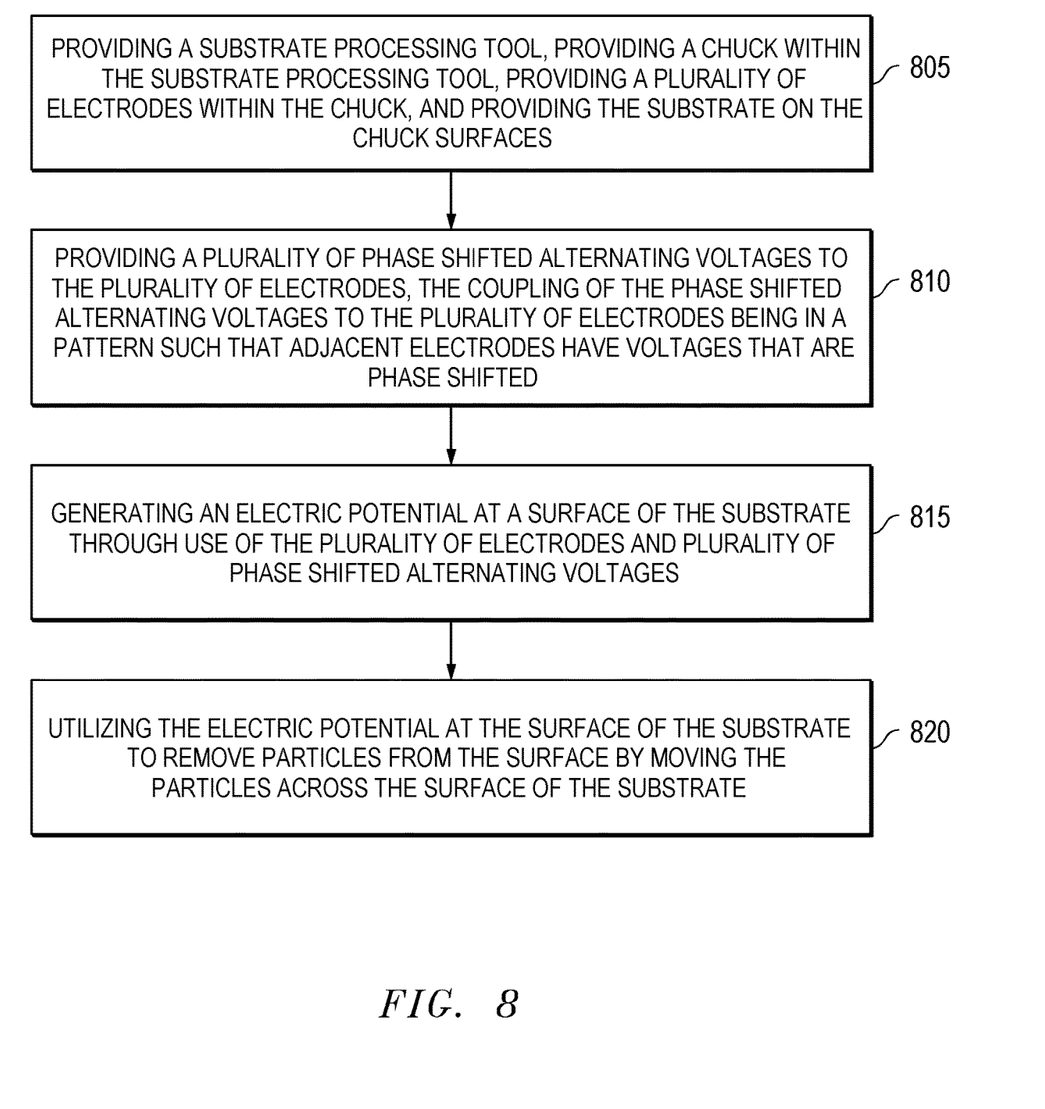
FIGS. 8-9 illustrate exemplary methods for utilizing the particle removal techniques described herein.
Figure 9:
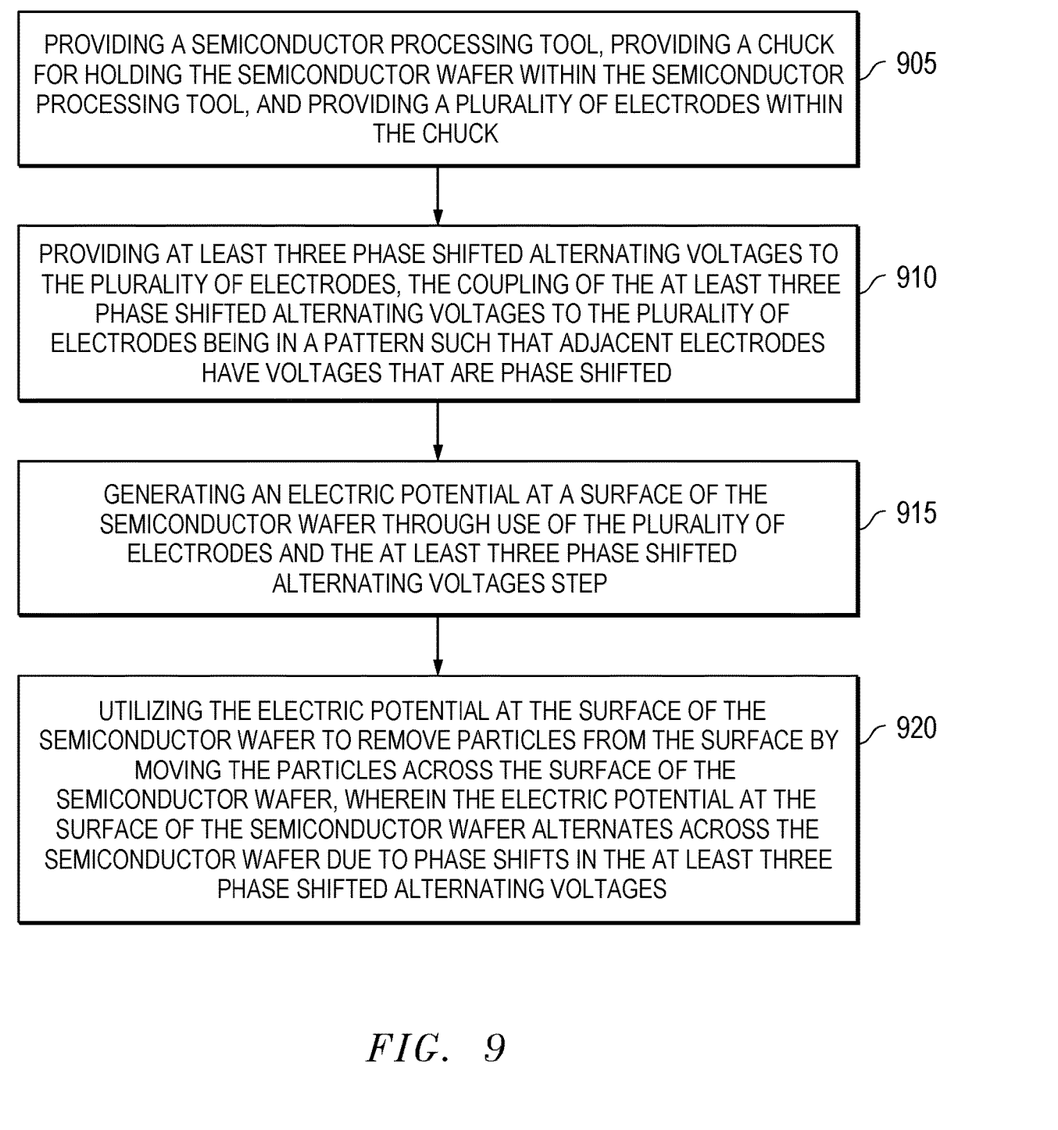

It will be recognized that the applications described above are merely exemplary, and many other processes and applications may advantageously utilize the techniques disclosed herein. FIGS. 8-9 illustrate exemplary methods for use of the processing techniques described herein. It will be recognized that the embodiments of FIGS. 8-9 are merely exemplary and additional methods may utilized the techniques described herein. Further, additional processing steps may be added to the methods shown in the FIGS. 8-9 as the steps described are not intended to be exclusive. Moreover, the order of the steps is not limited to the order shown in the figures as different orders may occur and/or various steps may be performed in combination or at the same time.

As shown in FIG. 8, a method of removing particles from a surface of a substrate is disclosed. The method includes step 805 of providing a substrate processing tool, providing a chuck within the substrate processing tool, providing a plurality of electrodes within the chuck, and providing the substrate on the chuck. The method also includes step 810 of providing a plurality of phase shifted alternating voltages to the plurality of electrodes, the coupling of the phase shifted alternating voltages to the plurality of electrodes being in a pattern such that adjacent electrodes have voltages that are phase shifted. The method further includes step 815 of generating an electric potential at a surface of the substrate through use of the plurality of electrodes and plurality of phase shifted alternating voltages. The method also includes step 820 of utilizing the electric potential at the surface of the substrate to remove particles from the surface by moving the particles across the surface of the substrate.

As shown in FIG. 9, a method of removing particles from a surface of a semiconductor wafer is disclosed. The method includes step 905 of providing a semiconductor processing tool, providing a chuck for holding the semiconductor wafer within the semiconductor processing tool, and providing a plurality of electrodes within the chuck. The method further includes step 910 of providing at least three phase shifted alternating voltages to the plurality of electrodes, the coupling of the at least three phase shifted alternating voltages to the plurality of electrodes being in a pattern such that adjacent electrodes have voltages that are phase shifted. The method also includes step 915 of generating an electric potential at a surface of the semiconductor wafer through use of the plurality of electrodes and the at least three phase shifted alternating voltages. The method further includes step 920 of utilizing the electric potential at the surface of the semiconductor wafer to remove particles from the surface by moving the particles across the surface of the semiconductor wafer, wherein the electric potential at the surface of the semiconductor wafer alternates across the semiconductor wafer due to phase shifts in the at least three phase shifted alternating voltages.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of removing particles from a surface of a substrate in a substrate processing tool, the method comprising:
    applying a plurality of phase shifted alternating voltages to a plurality of electrodes, the plurality of electrodes disposed within a chuck of the substrate processing tool, each of the plurality of electrodes separated by one of a plurality of spacings, a width of an electrode of the plurality of electrodes and a width of one of the plurality of spacings are each sized to be within 20% of a distance between a top of the plurality of electrodes and the surface of the substrate, the phase shifted alternating voltages being coupled to the plurality of electrodes in a pattern such that adjacent electrodes have voltages that are phase shifted; and
    generating an electric potential at a surface of the substrate by applying the plurality of phase shifted alternating voltages to the plurality of electrodes when the substrate is placed over the chuck, the generating removing the
    particles from the surface by moving the particles across the surface of the substrate.

2. The method of claim 1, wherein the plurality of phase shifted alternating voltages comprises at least three phase shifted voltages.

3. The method of claim 1, wherein the plurality of phase shifted alternating voltages comprises three phase shifted voltages having phase shifts of 120 degrees.

4. The method of claim 1, wherein the electric potential at the surface of the substrate alternates across the substrate due to phase shifts in the plurality of phase shifted alternating voltages.

5. The method of claim 1, wherein the width of the electrode of the plurality of electrodes and the width of one of the plurality of spacings are sized to be within 5% of the distance between the top of the plurality of electrodes and the surface of the substrate.

6. The method of claim 5, wherein the plurality of phase shifted alternating voltages comprises three phase shifted voltages having phase shifts of 120 degrees.

7. A method of removing particles from a surface of a semiconductor wafer in a semiconductor processing tool, the method comprising:
    providing a chuck for holding the semiconductor wafer within the semiconductor processing tool;
    providing a plurality of electrodes within the chuck, the plurality of electrodes is embedded in a dielectric material such that each electrode is separated from an adjacent one of the plurality of electrodes only by a region of the dielectric material, wherein a width of one of the plurality of electrodes and a width of the region of the dielectric material are about equal;
    providing at least three phase shifted alternating voltages to the plurality of electrodes, the at least three phase shifted alternating voltages being coupled to the plurality of electrodes in a pattern such that adjacent electrodes have voltages that are phase shifted; and
    generating an electric potential at a surface of the semiconductor wafer by applying the at least three phase shifted alternating voltages to the plurality of electrodes when the semiconductor wafer is placed over the chuck, the generating removing the particles from the surface by moving the particles across the surface of the semiconductor wafer, wherein the electric potential at the surface of the semiconductor wafer alternates across the semiconductor wafer due to phase shifts in the at least three phase shifted alternating voltages.

8. The method of claim 7, wherein the at least three phase shifted alternating voltages comprises three phase shifted voltages having phase shifts of 120 degrees.

9. The method of claim 8, wherein at least one geometric characteristic of the plurality of electrodes is dependent upon a height of the semiconductor wafer.

10. The method of claim 7, wherein the width of one of the plurality of electrodes and the width of the region of the dielectric material are each sized to be within 20% of a distance between a top of the plurality of electrodes and the surface of the semiconductor wafer.

11. The method of claim 1, further comprising performing a wet process to assist removing the particles from the surface.

12. The method of claim 1, further comprising blowing air jets across the substrate to assist removing the particles from the surface.

13. The method of claim 1, wherein the plurality of electrodes is embedded in a dielectric material such that each electrode is separated from an adjacent one of the plurality of electrodes only by a region of the dielectric material.

14. The method of claim 7, wherein the at least three phase shifted alternating voltages are applied at a frequency of 1 Hz to 500 kHz and in a range from 2000 V to 8000 V.

15. A method of removing particles from a surface of a substrate in a plasmas processing tool, the method comprising:
loading the substrate over a chuck within the plasma processing tool, the chuck comprising a plurality of electrodes embedded in a dielectric material, adjacent electrodes of the plurality of electrodes being separated only by a region of the dielectric material, wherein a width of one of the plurality of electrodes and a width of the region of the dielectric material are about equal;
powering a plasma for a plasma processing of the substrate; and
while powering the plasma, powering the plurality of electrodes with phase shifted alternating voltages so that each electrode is coupled to one of the phase shifted alternating voltages to generate a voltage wave moving across the surface of the substrate, the voltage wave causing particles to move across the surface and be removed from the surface.

16. The method of claim 15, wherein the width of the region of the dielectric material or the width of one of the plurality of electrodes is within a range between 0.3 mm to 3 mm.

17. The method of claim 15, wherein the width of an electrode one of the plurality of electrodes and the width of the region of the dielectric material are each sized to be within 20% of a distance between a top of the plurality of electrodes and the surface of the substrate.

18. The method of claim 15, wherein the width of one of the plurality of electrodes and the width of the region of the dielectric material are each sized to be within 5% of a distance between a top of the plurality of electrodes and the surface of the substrate.

19. The method of claim 15, wherein the width of one of the plurality of electrodes, the width of the region of the dielectric material between the electrodes, and a distance between a top of the plurality of electrodes and the surface of the substrate are about equal.

20. The method of claim 15, further comprising performing an assisting process to assist removing the particles from the surface.

* * * * *

UNITED STATES PATENT AND TRADEMARK OFFICE
CERTIFICATE OF CORRECTION

PATENT NO. : 11,376,640 B2
APPLICATION NO. : 16/573744
DATED : July 5, 2022
INVENTOR(S) : Antonio Luis Pacheco Rotondaro It is certified that error appears in the above-identified patent and that said Letters Patent is hereby corrected as shown below:

In the Claims

Claim 17, Column 12, Lines 12-13; delete "an electrode".

Signed and Sealed this
Eleventh Day of October, 2022

Katherine Kelly Vidal
*Director of the United States Patent and Trademark Office*